United States Patent [19]

Aldag et al.

[11] Patent Number: 4,891,301

[45] Date of Patent: Jan. 2, 1990

[54] PHOTOPOLYMERIZABLE RECORDING MATERIALS, PHOTORESIST LAYERS AND LITHOGRAPHIC PRINTING PLATES BASED THERON, AND NOVEL 4-QUINAZOLONE COMPOUNDS

[75] Inventors: Reinhard Aldag, Ludwigshafen; Peter Neumann, Wiesloch; Andreas Boettcher, Leimen; Thomas Bluemel, Erpolzheim; Friedrich Seitz, Friedelsheim, all of Fed. Rep. of Germany

[73] Assignee: BASF Aktiengesellschaft, Ludwigshafen, Fed. Rep. of Germany

[21] Appl. No.: 196,078

[22] Filed: May 17, 1988

[30] Foreign Application Priority Data

May 21, 1987 [DE] Fed. Rep. of Germany ....... 3717034

[51] Int. Cl.$^4$ .......................... G03C 1/71; G03C 7/00
[52] U.S. Cl. ..................... 430/281; 430/302; 430/920; 430/915; 522/9; 522/10; 522/15; 522/16; 522/25; 522/26
[58] Field of Search ............... 430/920, 334, 343, 281, 430/302; 522/9, 10, 15, 16, 26, 25, 63, 65

[56] References Cited

U.S. PATENT DOCUMENTS

| | | |
|---|---|---|
| 3,427,161 | 2/1969 | Laridon et al. . |
| 3,549,367 | 12/1970 | Teh-lin Chang . |
| 3,552,973 | 1/1971 | Fishman . |
| 3,615,568 | 10/1971 | Jenkins . |
| 3,883,351 | 5/1975 | Lewis . |
| 3,899,338 | 8/1975 | Lewis . |
| 4,065,315 | 12/1977 | Yamazaki et al. . |
| 4,162,274 | 7/1979 | Rosenkranz . |
| 4,228,232 | 10/1980 | Rousseau . |
| 4,271,251 | 6/1981 | Aotani et al. ................. 430/195 |
| 4,297,435 | 10/1981 | Jolly et al. ................... 430/270 |
| 4,304,923 | 12/1981 | Rousseau . |
| 4,425,424 | 1/1984 | Atland et al. ................. 430/210 |
| 4,504,573 | 3/1985 | Ishikawa . |
| 4,701,300 | 10/1987 | Merrem et al. ............... 430/196 |

FOREIGN PATENT DOCUMENTS

| | | |
|---|---|---|
| 005379 | 12/1981 | European Pat. Off. . |
| 0019219 | 6/1983 | European Pat. Off. . |
| 0138187 | 4/1985 | European Pat. Off. . |
| 1489425 | 10/1977 | United Kingdom . |
| 2068994 | 1/1981 | United Kingdom . |
| 80/01846 | 9/1980 | World Int. Prop. O. . |

OTHER PUBLICATIONS

J. Org. Chem., 36, 2262, (1974).
R. A. Abramovitch+E. M. Smith, "Pyridine and Its Derivatives", vol. 14, Part 2, (1974).
J. of General Chemistry of the USSR, vol. 30, (1960) p. 2333.
Journal Heterocyclic Chem., 17, 1065 (1980).

Primary Examiner—Paul R. Michl
Assistant Examiner—C. D. RoDee
Attorney, Agent, or Firm—Keil & Weinkauf

[57] ABSTRACT

Abstract of the disclosure: Novel photopolymerizable recording materials suitable in particular for producing photoresist layers and lithographic printing plates are composed of one or more photopolymerizable, olefinically unsaturated organic compounds, a photopolymerization initiator, a color-forming system composed of a color former and a photooxidant, novel 4-quinazolone compounds as sensitizers of the formula (I)

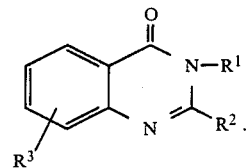

15 Claims, No Drawings

PHOTOPOLYMERIZABLE RECORDING MATERIALS, PHOTORESIST LAYERS AND LITHOGRAPHIC PRINTING PLATES BASED THERON, AND NOVEL 4-QUINAZOLONE COMPOUNDS

The present invention relates to photopolymerizable recording materials composed of one or more photopolymerizable, olefinically unsaturated organic compounds, optionally a polymeric binder, a photopolymerization initiator, a color-forming system, consisting of color former and photooxidant, and a sensitizer. They are suitable in particular for producing photoresist layers and lithographic printing plates. The invention also relates to novel 4-quinazolone compounds which are suitable for use as sensitizers.

Photopolymerizable recording materials for the purposes mentioned are known per se. They contain in general, besides a photopolymerizable, olefinically unsaturated organic compound, a polymeric binder and a photopolymerization initiator, a color-forming system which, on irradiation with actinic light, causes a color change in the irradiated areas. This color change is of great importance for the visual inspection and control of the recording materials following imagewise exposure. For instance, in the production of printed circuits or circuit boards by means of photoresist layers it is necessary to make sure after the imagewise exposure and before the removal of the unexposed areas from the photoresist layers that the negative was correctly emplaced. Furthermore, the color change makes it possible in the imagewise exposure of layers of photopolymerizable recording materials to check the image obtained following the development of the exposed layer and thereby make possible, for example, easy and reliable detection of any detachment of the image areas of the layer in the course of development. To permit effective visual inspection of these exposed layers, the colorforming system should on exposure bring about a very pronounced color contrast in the recording material, ideally so that the color formation gives very dark images if viewed in yellow light. Moreover, the color-forming system must be stable to storage to avoid undesirable color deepening in the photopolymerizable recording material in the time between manufacture and use.

Color-forming systems consist in general of a colorless or slightly colored dye precursor (color former) and an activator which on irradiation with actinic light converts the dye precursor into the colored compound. Suitable color formers are in particular leuco dyes or the slightly colored free bases or lactone forms of dyes. The activators for the color formers are customarily photooxidants, in particular organic halogen compounds which split off halogen free-radicals on irradiation with actinic light. Reference is made in this context to for example DE-A-2,306,353, DE-A-2,718,200, EP-B-2,805, EP-B-5,379 and WO-A-80/01,846. It has also already been proposed to use hexaarylbisimidazoles as photooxidants (cf. DE-A-1,924,317 and EP-B-19,219). The existing photopolymerizable recording materials generally contain in addition a sensitizer to enhance the sensitivity and to improve the photoreaction, for example a tertiary amine of an aromatic carbonyl compound, for example Michler's ketone.

The color-forming systems used in the existing photopolymerizable recording materials frequently show on imagewise irradiation of these materials with actinic light only a weak color change and insufficient contrast between exposed and unexposed areas. Nor is the storage stability of the color-forming systems hitherto used for photopolymerizable recording materials satisfactory in many cases, a deepening in color being observable even on storage in the dark. Those color-forming systems which contain an organic halogen compound as activator for the color former furthermore adversely affect the processing properties of the photopolymerizable recording materials. For instance, photoresist layers produced from these recording materials are for example not completely removable from metallic substrates following imagewise exposure and development as is required for example in production of printed circuits and circuit boards, but leave behind on the substrate a more or less pronounced residual layer which interferes with the further processing of the products. Furthermore, the halogen content can lead to signs of corrosion on metallic substrates. There is therefore a need for further, improved color-forming systems for use in photopolymerizable recording materials of the type in question.

DE-A-2,046,018 describes photographic recording materials in which a color former system has been applied to a base material. These photographic, non-photopolymerizable recording materials serve to produce colored images. Their color former system consists of a colorless or virtually colorless color former which can be converted into the desired form by oxidation, and as the photooxidant a heterocyclic compound having an acyloxy- or alkoxy-substituted ring nitrogen atom. The color formers described are leuco dyes and derivatives thereof. The photooxidants mentioned are in particular specifically substituted N-alkoxy- and N-acyloxy-pyridinium salts. The photographic recording materials described in DE-A-2,046,018 give on exposure to actinic light only a relatively weak color change and/or require for a stronger contrast between exposed and unexposed areas significantly longer exposure times than are acceptable for photopolymerizable recording materials.

A further drawback of existing photopolymerizable recording materials where hexaarylbisimidazolyls are used as photoactive compounds can be seen in the strong fluorescence of the sensitizer additives described for example in EP-A-138,187. Photoresist layers produced from such recording materials show appreciably reduced resolution and consequently fine conducting path structures are no longer satisfactorily reproducible.

It is an object of the present invention to provide photopolymerizable recording materials which incorporate a good color former system and which overcome the disadvantages of prior art products, ie. which are simple and easy to obtain, which in the relatively short exposure times required for photopolymerizable recording materials show on exposure to actinic light a large color change to produce a crisp and marked contrast between exposed and unexposed areas, which are highly stable to storage and which do not leave a residual layer on metallic substrates.

Sensitizers for use in the color-forming system of a photopolymerizable recording material include in the wider sense compounds which on irradiation of the photopolymerizable recording material with actinic light are able to absorb the actinic light and to transfer the excitation energy or electrons to the photochemically active compounds, ie. the photooxidant and the photopolymerization initiator, and thereby activate the photochemical reaction in the photopolymerizable recording material on irradiation thereof with actinic light.

We have found, surprisingly, that this object is achieved with photopolymerizable recording materials of the type described at the beginning when a substance acting as a photoinitiator and/or photooxidant is used as a sensitizer together with certain 4-quinazolone compounds.

The present invention accordingly provides a photopolymerizable recording material composed of one or more photopolymerizable olefinically unsaturated organic compounds, optionally a polymeric binder, one or more photopolymerization initiators, a color-forming system which on irradiation with actinic light causes an increase in the color intensity of the recording material, a sensitizer and optionally further additive and/or auxiliary substances, wherein the sensitizer comprises one or more compounds of the general formula I

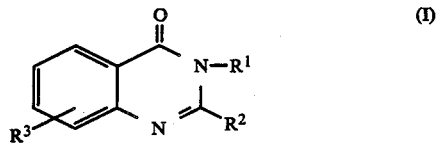

where $R^1$ is $C_1$- to $C_{12}$-alkyl, cycloalkyl, phenyl or halo-gen-, $C_1$- to $C_{12}$-alkyl-, nitrile-, trifluoromethyl-, $C_1$ to $C_{12}$-alkoxy-, —O—CO—$C_1$- to -$C_{12}$-alkyl-, —CO—O—$C_1$- to -$C_{12}$-alkyl- or $NR^4R^5$-substituted aryl or hetaryl, where $R^4$ and $R^5$ are identical or different and each is $C_1$ to $C_8$-alkyl, aryl-$C_1$- to -$C_6$-alkyl, where the aryl can be monosubstituted or polysubstituted by halogen, $C_1$- to $C_6$-alkyl or $C_1$- to $C_6$-alkoxy, or each is unsubstituted or $C_1$- to $C_6$-alkyl-, $C_1$- to $C_6$-alkoxy-, nitrile-, tri-fluoromethyl- and/or halogen-monosubstituted or -polysubstituted phenyl, unsubstituted or OH-, halogen-, CN-, —O—CO—$C_1$- to -$C_6$-alkyl- or -CO-0-$C_1$- to -$C_6$-alkyl-substituted $C_1$- to $C_{12}$-alkyl or oxaalkyl of 3 to 12 carbon atoms and 1 to 5 oxygen atoms, or $R^4$ and $R^5$ together form a saturated or unsaturated heterocyclic ring system, $R^2$ is $C_1$- to $C_{12}$-alkyl, cycloalkyl, phen-$C_1$- to -$C_6$-alkyl, aryl or hetaryl or $C_1$- to $C_{12}$-alkyl-, which may be substituted by OH, halogen, CN, -0-CO-$C_1$- to -$C_6$-alkyl or —CO—O—C-1—to —$C_6$—alkyl, $C_1$—to $C_6$—alkoxy—, OH—, halogen—, CN—or —O—CO—$C_1$—to —$C_6$—alkyl—, —CO—O—$C_1$—to —$C_6$—alkyl—, oxa—alkyl- of 2 to 12 carbon atoms and 1 to 6 oxygen atoms or $NR^6R^7$-substituted aryl or hetaryl, where $R^6$ and $R^7$ are identical or different and each is $C_1$- to $C_8$-alkyl, allyl, aryl-$C_1$- to -$C_6$-alkyl, where the aryl can be monosubstituted or polysubstituted by halogen, $C_1$- to $C_6$-alkyl or $C_1$- to $C_6$-alkoxy, or each is phenyl which is unsubstituted or monosubstituted or polysubstituted by $C_1$- to $C_6$-alkyl, $C_1$- to $C_6$—alkoxy and/or halogen, or each is OH—, halogen-, CN—, —O—CO—$C_1$—to —$C_6$—alkyl—or —CO—O—$C_1$—to —$C_6$—alkyl—substituted hd 1- to $C_{12}$-alkyl or oxaalkyl of 3 to 12 carbon atoms and 1 to 5 oxygen atoms, or $R^6$ and $R^7$ together form a saturated or unsaturated heterocyclic ring system, and R3 is hydrogen, $C_1$—to $C_{12}$—alkyl, $C_1$—to $C_{12}$—alkoxy, OH—, halogen—, CN—, —O—CO—$C_1$—to —$C_6$—alkyl—or —CO—O—$C_1$ to -$C_6$—alkyl—substituted $C_1$- to $C_{12}$-alkyl or oxaalkyl of 2 to 12 carbon atoms and 1 to 5 oxygen atoms, halogen, trialkylsilyl or perfluoro-$C_1$-to -$C_7$-alkyl, with the proviso that the maximum of the long-wave absorption band of these compounds is below 420 nm, preferably below 400 nm.

Preferred sensitizers are compounds of the formula (I) where $R^1$ and $R^2$ are each aryl as defined above and $R^3$ is hydrogen and also compounds of the formula (I) where $R^1$ is phenyl or benzyl substituted as above and $R^2$ is $NR^6R^7$-substituted aryl where $R^6$ and $R^7$ have the abovementioned meanings.

The color-forming system present so as to cause an increase in the color intensity of the recording material according to the invention on irradiation with actinic light comprises in general (a) one or more colorless or virtually colorless organic compounds which are oxidizable to a colored compound, preferably leuco dyes and, in particular triarylmethane dyes in the leuco form, and (b) a photooxidant for the colorless or virtually colorless organic compound (a).

Preference is given to those photopolymerizable recording materials which contain an hexaarylbisimidazolyl as photopolymerization initiator and/or photooxidant or an N-alkoxypyridinium salt as photooxidant.

The present invention also provides photoresist layers and lithographic printing plates based on the photopolymerizable recording materials according to the invention.

The present invention also provides 4-quinazolone compounds of the general formula

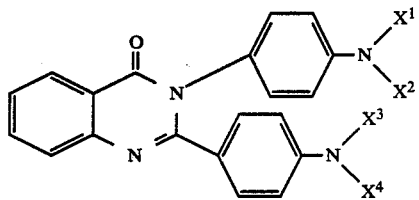

where $X^1$, $X^2$, $X^3$ and $X^4$ are identical to or different from each other and are each hydrocarbyl of 1 to 12 carbon atoms which may be substituted by OH, CN, halogen, phenyl, —O—CO—$C_1$—to —$C_6$—alkyl, —CO—O—$C_1$—to —$C_6$—alkyl or oxaalkyl of 3 to 12 carbon atoms and 1 to 5 oxygen atoms. Preferably $X^1$ to $X^4$ are each alkyl of 1 to 4 carbon atoms. Particular preference is given to novel 4-quinazolone compounds where $X^1$ to $X^4$ are each methyl or ethyl.

These 4-quinazolone compounds can be prepared by conventional methods of organic chemistry, for example from a suitably substituted isatoic anhydride by reaction with an aromatic amine in an inert solvent.

The individual components of the photopolymerizable recording materials according to the invention will now be discussed in detail.

According to the invention, suitable sensitizers are compounds of the general formula (I)

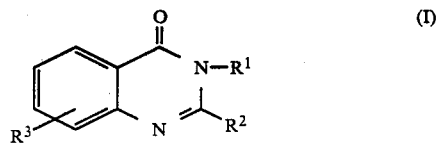

where
$R^1$ is $C_1$- to $C_{12}$-alkyl, eg. methyl, ethyl, n-propyl, isopropyl, n-butyl, isobutyl or tert-butyl, cycloalkyl, eg.

cyclohexyl, phenyl, or aryl or hetaryl, eg. phenyl, substituted by halogen, eg. fluorine, chlorine or bromine, by $C_1$- to $C_{12}$-alkyl, eg. methyl, ethyl, propyl, n-butyl, isobutyl, tert-butyl, hexyl or octyl, by $C_1$- to $C_{12}$-alkoxy, eg. methoxy, ethoxy, propoxy or butoxy, by nitrile, by trifluoromethyl, by —O—CO—$C_1$—to -$C_{12}$-alkyl, eg. acetoxy or propionoxy, by —CO—O—$C_1$- to -$C_{12}$-alkyl or by $NR^4R^5$, where $R^4$ and $R^5$ are identical or different and each is $C_1$- to $C_8$-alkyl, eg. methyl, ethyl, propyl or butyl, aryl-$C_1$- to -$C_6$-alkyl, eg. benzyl or phenylethyl, where the aryl can be monosubstituted or polysubstituted by halogen, eg. fluorine, chlorine or bromine, by $C_1$- to $C_6$-alkyl, eg. methyl, ethyl, propyl or butyl, or by $C_1$- to $C_6$-alkoxy, eg. methoxy, ethoxy, propoxy or butoxy, or each is phenyl which may be unsubstituted or monosubstituted or polysubstituted by $C_1$- to $C_4$-alkyl, eg. methyl, ethyl, propyl or butyl, by $C_1$-to $C_6$-alkoxy, eg. methoxy, ethoxy, propoxy or butoxy, by nitrile, by trifluoromethyl and/or by halogen, eg. fluorine, chlorine or bromine, or unsubstituted or OH-, halo- gen-, such as fluorine-, chlorine- or bromine-, CN-, —O—CO—$C_1$—to —$C_6$—alkyl—, eg. acetoxy—or propionoxy-, or —CO—O—$C_1$—to —$C_6$—alkyl—substituted $C_1$—to $C_{12}$alkyl or oxaalkyl of 3 to 12 carbon atoms and 1 to 5 oxygen atoms, eg. —$CH_2$—$CH_2$—O—$CH_3$, —$CH_2$—$CH_2$—O—$C_2H_5$, —($CH_2$)$_2$—O—$C_3H_7$, —$C_3H_6$—O—$CH_3$, —$C_3H_6$—$C_3H_7$, —($CH_2$)$_2$—O—($CH_2$)$_2$—O—$CH_3$ or —($CH_2$)$_2$—O—($CH_2$)—O—$C_2H_5$, or $R^4$ and $R^5$ together are bonded to form a five- or six-membered heterocyclic saturated or unsaturated N-containing ring system, eg. a julolidin, pyrazoline, carbazole, morpholine, piperidine or N-alkylpiperazine radical, $R^2$ is $C_1$- to $C_{12}$-alkyl, eg. methyl, ethyl, propyl, n-butyl, isobutyl, tert-butyl, hexyl, octyl or decyl, cycloalkyl, eg. cyclohexyl, phen-$C_1$- to -$C_6$-alkyl, eg. benzyl, aryl or hetaryl, eg. phenyl, naphthyl, biphenyl, pyridyl, furanyl or thienyl, or aryl or hetaryl, substituted by $C_1$- to $C_{12}$alkyl, eg. methyl, ethyl, n-propyl, isopropyl, nbutyl, isobutyl or tert-butyl, possible substituents of this $C_1$- to $C_{12}$-alkyl being OH, halogen, eg. fluorine, chlorine, bromine, CN, —O—CO—$C_1$—to —$C_6$—alkyl or —CO—O—$C_1$- to -$C_6$-alkyl, by $C_1$- to $C_6$alkoxy, eg. methoxy, ethoxy, propoxy or butoxy, halogen, such as fluorine, chlorine or bromine, OH, CN, —O—CO—$C_1$—to —$C_6$—alkyl or —CO—O—$C_1$—to $C_6$-alkyl or oxaalkyl of 2 to 12 carbon atoms and 1 to 6 oxygen atoms, eg. -$CH_2$—O—$CH_3$, —$CH_2$—O—$C_2H_5$, —$CH_2$—O—$C_3H_7$, —$CH_2$—$CH_2$—O—$CH_3$, —$CH_2$—$CH_2$—O—$C_2H_5$, —($CH_2$)$_2$—O—$C_3H_7$,—$C_3H_6$—O—$CH_3$, —$C_3H_6$—O—$C_3H_7$, -($CH_2$)$_2$—O—($CH_2$)$_2$—O—$CH_3$ or —($CH_2$)$_2$—($CH_2$)$_2$—O—$C_2H_5$ or by $NR_6R_7$, where $R^6$ and $R^7$ are identical or different and each is $C_1$- to $C_8$-alkyl, allyl, aryl-$C_1$- to -$C_6$-alkyl, where the aryl can be phenyl, naphthyl or biphenyl and can be monosubstituted or polysubstituted by halogen, eg. fluorine, chlorine or bromine, by $C_1$to $C_6$-alkyl, eg. methyl, ethyl, propyl or butyl, or by $C_1$- to $C_6$-alkoxy, eg. methoxy, ethoxy, propoxy or butoxy, or each is phenyl which is unsubstituted or monosubstituted or polysubstituted by $C_1$- to $C_6$-alkyl, eg. methyl, ethyl, propyl or butyl, by $C_1$- to $C_6$-alkoxy, eg. methoxy, ethoxy, propoxy or butoxy and/or by halogen, eg. fluorine, chlorine or bromine, or each is OH-, halogen-, such as fluorine-, chlorine- or bromine-, CN-, -0-CO-$C_1$- to -$C_6$-alkyl- or -CO-0-$C_1$- to -$C_6$-alkyl-substituted $C_1$- to $C_{12}$-alkyl or oxaalkyl of 3 to 12 carbon atoms and 1 to 5 oxygen atoms, eg. -(CH2)2-0-CH3, —(CH2)$_2$ —O—$C_2H_5$, —(CH2)$_2$ —O—$C_3H_7$, —$_3H_6$—O—$CH_3$, —$_3H_6$—O—$C_2H_5$-, —$_3H_6$—O—$_3H_7$, —($CH_2$)2-0—($CH_2$)$_2$ —O—$CH_3$, —($CH_2$)$_2$—O—($CH_2$)$_2$—O—($CH_2$)$_2$ —O—$C_2H_5$ or —($CH_2$)$_2$—O—($CH_2$)$_2$ —O—$C_2H_5$ or $R^6$ and $R^7$ together form a heterocyclic saturated or unsaturated ring system, eg. a julolidin, pyrazoline, carbazole, morpholine, piperidine or N-alkylpiperazine radical, and $R^3$ is hydrogen, $C_1$- to $C_{12}$-alkyl, eg. methyl, ethyl, n-propyl, isopropyl, n-butyl, isobutyl or tert.butyl, $C_1$- to $C_{12}$-alkoxy, eg. methoxy, ethoxy, propoxy or butoxy, OH-, halogen-, eg. fluorine-, chlorine—or bromine—, CN—, —O—CO—$_1$—to —$_6$—alkyl—or —CO—O—$_1$—, to —$_6$—alkyl—substituted $C_1$- to $C_{12}$-alkyl or oxaalkyl of 2 to 12 carbon atoms and 1 to 5 oxygen atoms, trialkylsilyl of to 4 carbon atoms in the alkyl group, eg. trimethylsilyl or perfluoro—$_1$- to -$C_7$-alkyl, eg. trifluoromethyl, with the proviso that the maximum of the long-wave absorption band of these compounds is below 420 nm, preferably below 400 nm.

Preferred sensitizers for the photopolymerizable recording materials according to the invention are those of the general formula (I) where $R^1$ is aryl as defined above, in particular substituted phenyl or benzyl, $R^2$ is substituted aryl as defined above, in particular $NR^6R^7$substituted phenyl, and $R^3$ is $C_1$- to $C_6$-alkyl, $C_1$ to $C_6$-alkoxy or in particular hydrogen.

Examples of suitable and very particularly preferred sensitizers are:

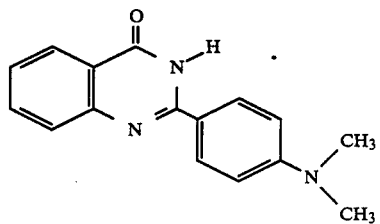

(II)

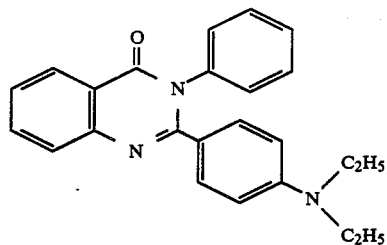

(III)

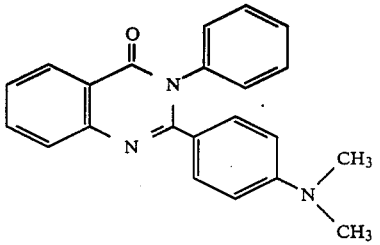

(IV)

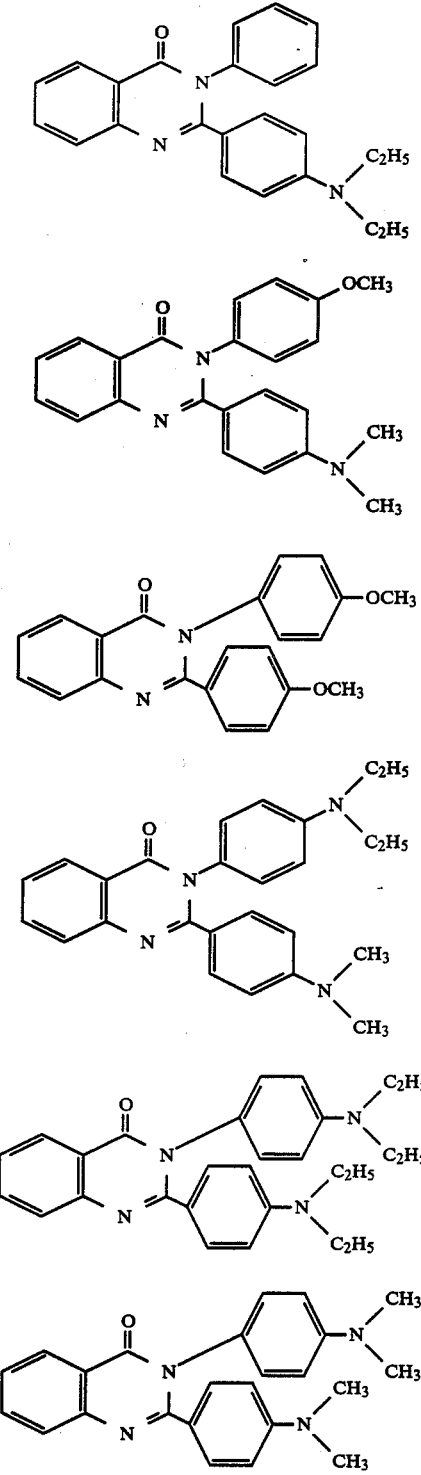

The use according to the invention of sensitizers of the type described above in the color-forming system together with photooxidants b) surprisingly brings about in the photopolymerizable recording materials according to the invention a very substantial deepening in color intensity and contrast formation even in the relatively short exposure times to actinic light required for photopolymerizable recording materials.

The compounds which according to the invention act as sensitizers are partly known (eg. GB-A 2,068,994) or can be prepared in line with methods described in the literature, for example by heating an N-benzoyl anthranilanilide in a dehydrating medium, such as acetic anhydride or benzoyl chloride,

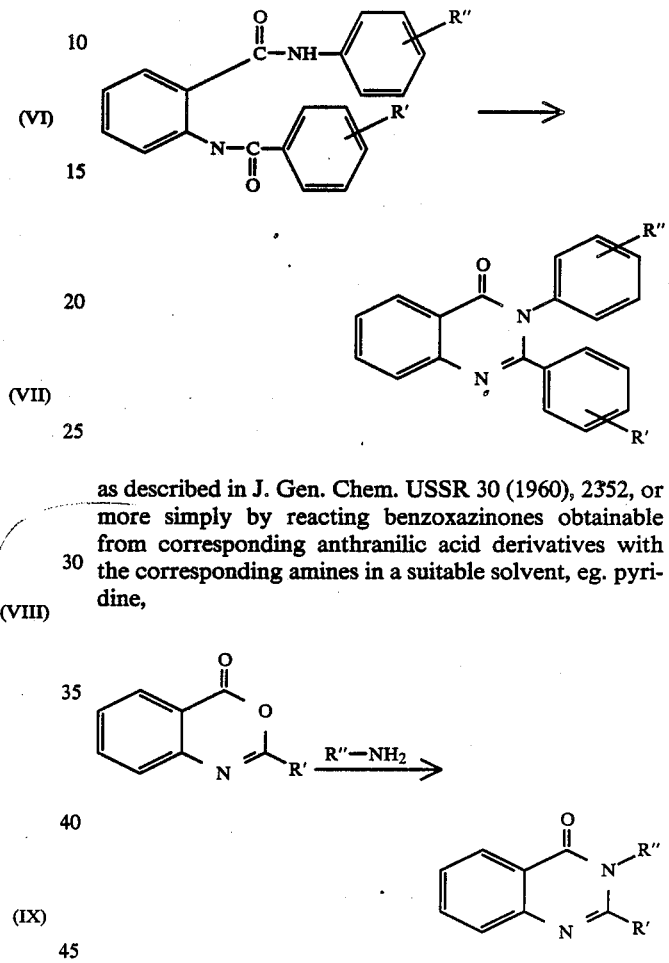

as described in J. Gen. Chem. USSR 30 (1960), 2352, or more simply by reacting benzoxazinones obtainable from corresponding anthranilic acid derivatives with the corresponding amines in a suitable solvent, eg. pyridine, as described for example in J. Heterocycl. Chem. 17 (1980) 1065.

The sensitizers are generally used in amounts of from 0.01 to 10, preferably of from 0.1 to 1, % by weight, based on the photopolymerizable composition.

Suitable photooxidants (b) for use in the colorforming system of the photopolymerizable recording materials according to the invention comprise in particular b1) hexarylbisimidazolyls of the formula (XI) or a structurally isomeric form where $Ar^1$ and $Ar^2$ are as defined below, or b2) hetaromatic saltlike systems containing one or more groups of the formula (XII)

(XII)

The term saltlike systems as used herein also include inner salts, ie. ionic compounds where the cationic and anionic groups are linked to each other by covalent bonds. A suitable hetaromatic system in these salts which contains one or more groups of the abovementioned general formula (XII) comprises in particular six-membered hetaromatic rings containing one, two or even three ring nitrogen atoms and ring-substituted derivatives thereof, including the benzofused and hetarylfused representatives.

By proper selection of the ring substitution in the radicals Ar of the formula (XI), or in the hetaromatic system, and the radical $R^8$ in the group of the general formula (XII) it is possible to affect and vary the activity on irradiation with actinic light and the stability of photooxidants (b). In addition, the anions in photooxidants (b2) also have an effect on the properties of the photopolymerizable recording materials. Customarily and advantageously, the photoxidant (b) is chosen in such a way that its molar extinction coefficient $\epsilon$ in the wavelength range from 300 to 420 nm, in particular in the range from 320 to 400 nm, is smaller than that of the sensitizer also present in the photopolymerizable recording materials according to the invention for photooxidant (b) and, if present, of the sensitizer for the photopolymerization initiator.

Photooxidants (b1) are according to the formula (XI) 2,4,5-triarylimidazole dimers where two imidazole radicals are linked by a covalent bond and $Ar^1$ is substituted or unsubstituted phenyl, preferably phenyl substituted in the 4-position by $C_{1-6}$-alkyl or $C_{1-6}$-alkoxy, and $Ar^2$ is phenyl or preferably phenyl substituted in the 2- or 2'-position by halogen, such as F, Cl or Br, or by alkyl. The 2,4,5-triarylimidazole dimers convert under the influence of light and/or heat into the true photooxidants, namely triarylimidazolyl radicals.

Particular preference is given to 2,2'-bis(o-chlorophenyl)-4,4',5,5'-tetraphenylbisiidazolyl and 2,2'-bis(o-chlorophenyl)-4,4',5,5'-tetra(p-methoxyphenyl)-bisimidazolyl.

These hexaarylbisimidazolyls are known or are easily preparable by methods as described for example in J. Org. Chem. 36 (1971), 2262.

Photooxidants (b2) include in particular those pyridinium, pyrazinium and pyrimidinium salts which contain a group of the abovementioned general formula (XII) built in the hetaromatic ring, and also the ring-substituted derivatives thereof which contain one or more ring substituents of the abovementioned kind in the hetaromatic ring, and also fused derivatives thereof, for example benzofused pyridinium salts of the type in question, such as for example the corresponding unsubstituted or ring-substituted quinolinium, isoquinolinium or phenanthridinium salts. In the general formula (XII) for photooxidants (b2), $R^8$ can be substituted or unsubstituted alkyl or aryl, or cycloalkyl. Further photooxidants are recited in detail in German Patent Application P . . . O.Z. No. 0050/39193. The radical $R^8$ in the group of the general formula (XII) is preferably alkyl or aryl, in particular alkyl of 1 to 6 carbon atoms. Preferred ring substituents for these salts include in particular substituted or unsubstituted alkyl.

Preferred anions for these salts are inter alia benzenesulfonate, tosylate, alkylsulfonate, trifluoromethanesulfonate or tetrafluoroborate anions. The N-alkoxyand N-aryloxy-pyridinium salts, the N-alkoxy- and N-aryloxy-picolinium salts and also the N-alkoxy- and N-aryloxylutidinium salts have proved to be particularly advantageous for use according to the invention.

Photooxidants (b2) include for example compounds of the following general formulae (XIII) to (XXI):

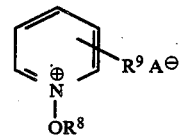
(XIII)

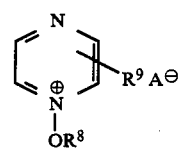
(XIV)

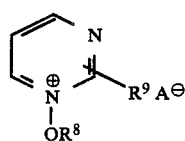
(XV)

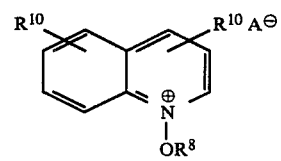
(XVI)

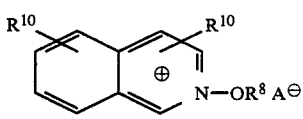
(XVII)

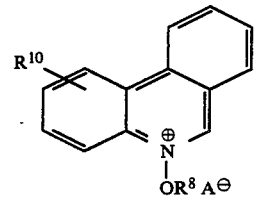
(XVIII)

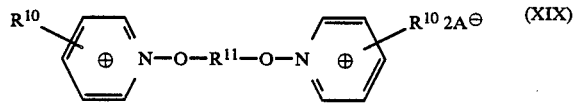
(XIX)

(XX)

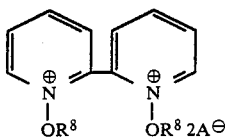

In these formulae (XIII) to (XXI) $R^8$ is preferably alkyl or aryl, in particular alkyl of 1 to 6 carbon atoms, eg. methyl, ethyl or i-propyl. In these formulae $R^{10}$ is hydrogen (corresponding to an unsubstituted hetaromatic ring) or one or more ring substituents of the abovementioned type. Preferably the $R^{10}$s are hydrogen or one or more, substituted or unsubstituted, alkyl, aryl, alkoxy or chlorine. In particular, $R^{10}$ is hydrogen or one or more methyl, preferably 2methyl, 2,6-dimethyl, or in the general formulae (XIII), (XIV) and (XIX), even 3,5-dimethyl. In the formula (XIX), R.11 is alkylidene, in particular of 2 to 6 carbon atoms or xylidene, eg. p-xylidene. Furthermore, in the formulae (XIII) to (XXI) $A\ominus$ is an acid anion, in particular of the type mentioned above. Preferred acid anions for the compounds of the general formulae (XIII) to (XXI) are the benzenesulfonate, toluenesulfonate, methylsulfonate, n-octylsulfonate, tetrafluoroborate and trifluoromethanesulfonate anion. Where one of the radicals $R^8$ or $R^{10}$ contains an anion group, for example a sulfonate group, it is of course the case that the anion disappears in the general formulae (XIII) to (XXI).

Of the salts to be used as photooxidants (b), compounds of the general formula (XIII) are of particular importance, particularly good utility being possessed specifically by those compounds where $R^{10}$ is hydrogen or one or two methyls and $R^8$ is alkyl of 1 to 3 carbon atoms, such as methyl, ethyl or i-propyl.

Examples of compounds which according to the invention are usable as photooxidants (b2) in the photopolymerizable recording materials are: N-methoxy-2-picolinium bromide, N-methoxy-2-picolinium methylsulfate, N-methoxy-2-picolinium methanesulfonate, N-methoxy-2-picolinium trifluoromethanesulfonate, N-methoxy-2-picolinium n-octylsulfonate, N-methoxy-2-picolinium o/p-dodecylbenzene-sulfonate, N-methoxy-2-picolinium hexachloroantimonate, N-methoxy-2-picolinium n-pentylsulfonate, N-ethoxy-2-picolinium bromide, N-ethoxy-2-picolinium n-pentylsulfonate, N-ethoxy-2-picolinium n-octylsulfonate, N-ethoxy-2-picolinium p-toluenesulfonate, N-ethoxy-2-picolinium tetrafluoroborate, N-ethoxy-2-picolinium hexafluorophosphate, N-ethoxy-2-picolinium hexachloroantimonate, N-isopropoxy2-picolinium p-toluenesulfonate, 0-(2'-picolinium-1'-yl)3-hydroxypropanesulfonate, N-ethoxy-3-picolinium n-pentylsulfonate, N-ethoxy-3-picolinium n-octylsulfonate, N- methoxy-4-picolinium methanesulfonate, N-methoxy-4-picolinium n-octylsulfonate, N-methoxy-4-picolinium p-toluenesulfonate, N-ethoxy-4-picolinium n-pentylsulfonate, N- ethoxy-4-picolinium n-octylsulfonate, N-ethoxy-4-methoxypyridinium tetrafluoroborate, 1,4-dimethoxypyridinium tetrafluoroborate, N-tert-butoxypyridinium perchlorate, N-methoxy-3,5-lutidinium p-toluenesulfonate, N-methoxy2,6-lutidinium bromide, N-methoxy-2,6-lutidinium trifluoromethanesulfonate, N-methoxy-2,6-lutidinium p-toluenesulfonate, N-methoxy-2,6-lutidinium hexachloroantimonate, N-ethoxy-2,5-lutidinium tetrafluoroborate, N-ethoxy-2,6lutidinium hexachloroantimonate, N-ethoxy-2,6-lutidinium hexafluorophosphate, 0-(2',6'-lutidinium-1'-yl)-3-hydroxypropanesulfonate, N-methoxy-2-styryl-pyridinium p-toluenesulfonate and N,N'-p-xylyleneoxybis(2-methylpyridinium) dibromide.

The salts of the abovementioned kind to be used as photooxidants (b2) can be prepared in a conventional manner. Reference may be made in this context for example to R.A. Abramovitch and E.M. Smith in Pyridine and its Derivatives, volume 14 supplement, part 2, page 1 ff, J. Wiley, New York (1974).

The color-forming system present in the photopolymerizable recording materials according to the invention, which on irradiation of the recording materials with actinic light causes an increase in the color intensity in these materials, contains besides photooxidants (b) of the aforementioned type one or more colorless or virtually colorless organic compounds (a) which are oxidizable to colored compounds: These color-forming, initially colorless or virtually colorless organic compounds (a) will hereinafter also be referred to as color formers. Suitable color formers (a) are in particular leuco dyes, a leuco dye being the reduced form of a dye and having in general 1 or 2 hydrogen atoms whose removal, together with one or two electrons leads to generation of the dye. These leuco dyes are essentially colorless or are at most slightly colored in a low-intensity color which is appreciably different from the color of the actual dye (oxidized form). Suitable leuco dyes are in particular the diarylmethane and triarylmethane dyes in their leuco form and the leuco forms of dyes having a triarylmethane structure where two of the aryl radicals are linked with each other by an N, S or 0 atom. This includes inter alia the leuco form of aminoacridine dyes, of aminoxanthene dyes and of aminothioxanthene dyes. Also suitable are leuco dyes of the triarylmethane type where one dialkyl- or alkylaryl-aminophenyl radical has been replaced by an N-alkyl-substituted carbazolyl group. Color formers (a) can also be for example leucomethines. Leuco dyes which are suitable for use as color formers (a) for the photopolymerizable recording materials according to the invention are described for example in U.S. Pat. No. 3,552,973. Of particular interest here are leucotriarylmethane dyes, eg. leuco crystal violet, leuco malachite green, leuco basic blue, leuco pararosaniline and leuco patent blue A or V.

The ratio of color former (a) and photooxidant (b) in the photopolymerizable recording materials has to be chosen in such a way as to ensure in all cases a sufficient color change on irradiation with actinic light. It is usually found to be sensible to use the photopolymerizable photooxidant (b) in a small excess (by weight) compared with color former (a). As for the rest, quantities and mixing ratios of color former (a) and photooxidant (b) are selected in such a way in a conventional manner that the photopolymerizable recording materials meet the stated requirements in respect of exposure time, color contrast etc.

Besides sensitizer and a color-forming system of the type described above, the photopolymerizable recording materials according to the invention contain one or more photopolymerizable, olefinically unsaturated organic compounds, optionally a polymeric binder, one or more photopolymerization initiators and optionally further additive and/or auxiliary substances. These further constituents of the photopolymerizable recording materials according to the invention can be the compounds used in conventional photopolymerizable compositions as used for producing overcoats, printed plates, photoresist materials and the like and described for example in the references cited at the beginning.

The photopolymerizable, olefinically unsaturated organic compounds can be olefinically unsaturated monomers, olefinically unsaturated oligomers and/or polymers containing photopolymerizable, olefinic double bonds. The photopolymerizable, olefinically unsaturated organic compounds contain preferably vinylic double bonds, in particular vinyl groups activated by conjugation and/or adjacency to 0 or N atoms. This includes in particular those vinyl groups adjacent to ester or amide groups, eg. acryloyl and methacryloyl groups. The photopolymerizable, olefinically unsaturated organic compounds can be not only monofunctional but also polyfunctional, ie. they can possess one or indeed more than one photopolymerizable olefinic double bond. Customarily, the photopolymerizable recording materials contain bifunctional or polyfunctional olefinically unsaturated, photopolymerizable compounds alone or mixtures thereof with monofunctional olefinically unsaturated photopolymerizable compounds. The photopolymerizable olefinically unsaturated monomers have in general a molecular weight of up to about 1,000. The number average molecular weight of the photopolymerizable olefinically unsaturated oligomers is preferably within the range from 1,000 to 10,000, in particular from about 1,500 to 6,000. The weight average molecular weight of the polymers containing photopolymerizable olefinic double bonds is in general above 15,000. The photopolymerizable, olefinically unsaturated organic compounds can be used alone or mixed with each other. The nature and amount of the photopolymerizable, olefinically unsaturated organic compounds used depend largely on the intended application of the photopolymerizable recording materials and on the nature of the other constituents used.

Representatives of photopolymerizable monomers are in particular the derivatives of (meth)acrylic acid, specifically (meth)acrylic esters. Examples thereof are di- and tri-(meth)acrylates of ethylene glycol, diethylene glycol, triethylene glycol or polyethylene glycols having a molecular weight of up to about 500, 1,2-propanediol, 1,3-propanediol, polypropylene glycols having a molecular weight of up to about 500, 1,4-butanediol, 1,6-butanediol, 1,1,1-trimethylolpropane, 2,2-dimethylpropanediol, glycerol or pentaerythritol, pentaerythritol tetra(meth)acrylate, glucose tri- or tetra-(meth)acrylate, and also the monoacrylates and monomethacrylates of the diols and polyols mentioned, eg. ethylene glycol di-, tri- or tetraethylene glycol mono(meth)acrylate, propanediol mono(meth)acrylate and butanediol mono(meth)acrylate, similarly the (meth)acrylates of monoalkanols, in particular of those having 1 to 20 carbon atoms. Aside from the preferred acrylates and methacrylates of the aforementioned kind, suitable photopolymerizable monomers also include allyl compounds and other vinyl compound$, eg. N-vinylpyrrolidone, N-vinylcarbazole, N-vinylcaprolactam, vinyl acetate, vinyl propionate, (meth)acrylamide, N-methylol (meth)acrylamide, the bisether of ethylene glycol and N-methylol (meth)acrylamide, vinyl carbamates, bisacrylamidoacetic acid, glyoxalbisamide and the like.

Highly suitable photopolymerizable, olefinically unsaturated organic compounds for the photopolymerizable recording materials according to the invention also include monomeric urethane acrylates or methacrylates having two or more acryloyl and/or methacryloyl groups. Such monomeric urethane (meth)acrylates can be obtained for example by reacting aliphatic di- or polyols with organic diisocyanates in an equivalent ratio OH:NCO of about 1:2 and subsequent reaction of the free isocyanate groups of the reaction products obtained with suitable acryloyl and/ or methacryloyl compounds, for example hydroxyalkyl (meth)acrylates. Suitable aliphatic di- and/or polyols are inter alia the dihydroxy and polyhydroxy compounds mentioned above in connection with di- and tri-(meth)acrylates; examples of organic diisocyanates are hexamethylene diisocyanate, tolylene diisocyanate, isophorone diisocyanate and the like: hydroxyalkyl (meth)acrylates are for example hydroxyethyl (meth)acrylate, propanediol mono(meth)acrylate and butanediol mono(meth)acrylate. Similarly suitable and advantageous are monomers having two or more acryloyl and/or methacryloyl groups, as can be obtained for example by reacting di- or polyglycidyl compounds with acrylic acid and/or methacrylic acid or by reacting glycidyl (meth)acrylate with di- or polyols, in particular aliphatic di- or polyols, as mentioned above for example in connection with di- and tri(meth)acrylates. Suitable di- and polyglycidyl compounds here are in particular the di- and polyglycidyl ethers of polyhydric alcohols or of polyhydric phenols, for example of bisphenol A or of substitution products thereof. Examples of such acryloyl- and/or methacryloyl-containing monomers are the reaction products of bisphenol A bisglycidyl ether with acrylic and/or methacrylic acid in a molar ratio of about 1:2, and 1,6-hexanediol bisglycidyl ether methacrylate.

It has proved advantageous, in particular for the production of photoresist layers, if the photopolymerizable, olefinically unsaturated organic compounds in the photopolymerizable recording materials are oligomers having two or preferably more than two acryloyl and/or methacryloyl groups. They can comprise for example acryloyland/or methacryloyl-containing oligomeric urethane resins or those based on di- or polyepoxies as disclosed and described as such in the literature. For aqueously developable photopolymerizable recording materials, those oligomers of the type in question are of particular interest here which, besides acryloyl and/or methacryloyl groups, additionally contain free carboxyl groups in the molecule. The proportion of free carboxyl groups in these photopolymerizable oligomers is advantageously sufficiently high for the oligomers to have an acid number within the range from 50 to 150 mg of KOH/g. Suitable photopolymerizable oligomers of this type are described for example in DE-A-2,442,527, DE-C-2,557,408 or else DE-A-2,917,483. Further photopolymerizable oligomers whose use in the photopolymerizable recording materials according to the invention has proved to be advantageous can be prepared for example by reacting the free hydroxyl groups of an acryloyl- and/or methacryloyl-containing diol or polyol compound with polybasic carboxylic acids or derivatives thereof, in particular cyclic carboxylic anhydrides, in such a way as to form the acidic partial esters of the polybasic carboxylic acids or derivatives thereof and subsequently reacting a proportion of the free carboxyl groups on the reaction product thus obtained with diepoxies and/or polyepoxies to give chain extension with or without branching. The acryloyl- and/or methacryloyl-containing diol or polyol compounds which serve as the starting material for preparing such oligomers are advantageously prepared by reacting diepoxy or polyepoxy compounds, for example diglycidyl or polyglycidyl ether$ or diglycidyl or polyglycidyl esters, with acrylic acid and/or methacrylic acid in an equivalent ratio of glycidyl groups:COOH groups of about 1:1. The diepoxy or polyepoxy compounds can also, for example, be extended before or during the reaction with (meth)acrylic acid by reaction with dicarboxylic acids. Representative examples of such oligomers of the last kind are those products obtainable by reacting bisphenol A bisglycidyl ether with acrylic and/or methacrylic acid or a mixture of from about 30 to 70 mol % of a dicarboxylic acid, for example adipic acid, and from about 30 to 70 mol % of acrylic and/or methacrylic acid in an equivalent ratio of glycidyl groups:total COOH of 1:1, reacting the hydroxyl groups of the reaction product thus obtained with a cyclic dicarboxylic anhydride, for example phthalic anhydride, alone or in admixture with a minor amount of the anhydride of another polybasic carboxylic acid, for example trimellitic anhydride, in an equivalent ratio of OH groups:anhydride groups of 1:1 to form the acidic partial ester of the polybasic carboxylic acid, and finally reacting a proportion of the free carboxyl groups of the reaction product thus obtained with a diglycidyl and/or polyglycidyl ether, for example bisphenol A bisglycidyl ether or pentaerythritol glycidyl ether in an equivalent ratio of COOH groups:glycidyl groups of >1:1, preferably in the range from about 1.15:1 to 5:1.

Examples of polymers containing photopolymerizable olefinic double bonds are those light-sensitive polymers described for example in DE-A-1,522,359.

It will be readily understood by those skilled in the art that the photopolymerizable, olefinically unsaturated organic compounds, which customarily have a boiling point of above 100°C. under atmospheric pressure, have to be selected in such a way that they are compatible with the other constituents of the photopolymerizable recording materials, in particular in any polymeric binders used.

The preferred photopolymerizable recording materials, besides the photopolymerizable, olefinically unsaturated organic compounds, contain polymeric binders, in particular if the photopolymerizable, olefinically unsaturated organic compounds present exclusively comprise photopolymerizable monomers and/or photopolymerizable oligomers. These polymeric binders should be soluble or at least dispersible in the developer solvents for the photopolymerizable recording materials to make it possible to wash out the unexposed and uncrosslinked areas of the layer from these materials after imagewise exposure to actinic light. Examples of suitable polymeric binders are: linear polyamides and in particular alcoholsoluble copolyamides as described in French Patent No. 1,520,856, cellulose derivatives, in particular those which can be washed out with aqueous alkaline developers, vinyl alcohol polymers and polymers and copolymers of vinyl esters of aliphatic monocarboxylic acids of 1 to 4 carbon atoms, as of vinyl acetate, having different degrees of hydrolysis, homopolymers and copolymers of vinylpyrrolidone, of vinyl chloride or of styrene, polyurethanes and polyether urethanes, polyester urethanes, polyester resins, diene polymers and copolymers, such as block copolymers of butadiene and/or isoprene and styrene or α-methylstyrene, but also, in particular for the production of photoresist layers and lithographic printing plates, alkyl acrylate and methacrylate polymers and copolymers. Examples of suitable and preferred polymeric binders are inter alia polymethacrylate, polymethyl methacrylate, alkyl (meth)acrylate copolymers which contain amino-containing comonomers, eg. dimethylaminoethyl metharylate, in polymerized form, copolymers of alkyl (meth)acrylates and (meth)acrylic acid which may contain still further comonomers, eg. N-vinyllactams, hydroxyalkyl (meth)acrylates or styrene, in polymerized form, copolymers of styrene and maleic anhydride and/or maleic half-esters or even copolymers of styrene, maleic anhydride and (meth)acrylic acid.

The photoolymerizable recording materials according to the invention further contain, in addition to photooxidant (b) of the color-forming system, as further light-sensitive component one or more photopolymerization initiators which are capable under the influence of actinic light of initiating the free radical polymerization of the photopolymerizable, olefinically unsaturated organic compounds in the photopolymerizable recording materials. Of particular advantage here are those aromatic carbonyl compounds known for use as photoinitiators, in particular aromatic ketones which have a structural unit of the general formula (XXII)

where Ar is substituted or unsubstituted aryl, in particular substituted or unsubstituted phenyl. The two Ar's in the structural unit of the general formula (XXII) can be identical or different and may also be linked to each other, for example via a —CH—group or an —S—atom. Preferably, the photopolymerization initiators selected have no strong absorption ($\epsilon > 5000$) in the wavelength range of the actinic light in which the sensitizers present in the photopolymerizable recording materials according to the invention have their absorption band(s). Specific examples of preferred photopolymerization initiators are: benzophenone, substituted benzophenones, such as 4,4'-dichlorobenzophenone, benzoin ethers, benzil dialkyl ketals, polynuclear unsubstituted quinones, such as anthraquinone, benzanthraquinone, 2-ethylanthraquinone or tertbutylanthraquinone, thioxanthone and derivatives thereof, eg. 2-methyl thioxanthone and 2-chlorothioxanthone. Besides the constituents mentioned, the photopolymerizable recording materials according to the invention may also contain further customary additive and/or auxiliary substances which improve and/or modify the processing and/or application properties of the recording materials. These substances include inter alia thermal polymerization inhibitors, inorganic or organic pigments or dyes which can act not only as contrast aids but also as layer consolidants, low molecular weight adhesion promoters, flow control agents, delusterants, lubricants, plasticizers and the like.

The constituents of the photopolymerizable recording materials according to the invention are used in the customary amounts and mixing ratios and are present in the recording materials in homogeneous mixture. To prepare the photopolymerizable recording materials, the constituents are homogeneously mixed with one another in a conventional manner, for example in solution in a suitable solvent or solvent mixture or in a mixing apparatus, such as a kneader, extruder or the like. Preferably, the nature and the quantity of the individual constituents of the photopolymerizable recording materials according to the invention are adapted to one another in such a way that the resulting mixture is solid (after removal of solvent, if the mixture was prepared in solution).

The photopolymerization and the color formation or the deepening of the color intensity in the photopolymerizable recording materials according to the invention are triggered using actinic light of wavelengths of from 300 to 420 nm, in particular of from 320 to 400 nm. Suitable sources of radiation are inter alia high pressure mercury lamps, medium pressure mercury lamps, low pressure mercury lamps, superactinic fluorescent tubes, pulsed xenon lamps, UV fluorescent tubes and the like.

The recording materials according to the invention can be processed in a conventional manner into UV-curable overcoats, photopolymer printing plates of any kind, relief forms, photoresists and the like. They are particularly advantageous wherever irradiation with actinic light is to bring about not only efficient photopolymerization in the exposed areas but also a very big change in the color intensity and a very big color contrast, as for example in light-sensitive recording elements having a thin layer of the photopolymerizable recording materials according to the invention mounted on a base material, in particular dry film resists for dry layer transfer and lithographic printing plates. Suitable base materials for these light-sensitive recording elements are the dimensionally stable, preferably flexible, materials customary for this purpose, such as plastic films or foils and metal sheets. Proven base materials for dry film resists are in particular polyester foils, made for example of polyethylene terephthalate or polybutylene terephthalate. Lithographic printing plate base materials comprise in particular offset aluminum sheets whose surface has been mechanically, chemically and/or electrochemically roughened and pretreated in a conventional manner. The thin layer of photopolymerizable recording material according to the invention, the thickness of which for dry film resists is customarily within the range from about 10 to 100 μm, in particular within the range from about 1 to 6 μm, is applied to the base materials using an existing application technique, for example casting from solution, spincoating or the like.

To produce lithographic printing forms, the lithographic printing plates produced using the photopolymerizable recording materials according to the invention are subjected in a conventional manner to imagewise exposure with actinic light and developed by washing out with a suitable developer solvent. To produce imagewise structured resist patterns, the photopolymerizable recording material according to the invention is applied in layer form to the substrate to be protected or to be permanently modified, either directly, for example from solution, or by laminating on a prefabricated layer by the layer transfer method using a dry film resist. Suitable substrates, given that the nature of the substrate is known to depend on the particular application intended for the resist pattern to be produced, are the materials customary and known in this area, for example copper sheets or copperclad base materials. To produce the imagewise structured resist pattern, the photoresist layer of photopolymerizable recording material according to the invention applied to the substrate is subjected to imagewise exposure with actinic light and then developed to remove the unexposed areas of the layer with a suitable washout developer solvent. The imagewise exposure of the photopolymerizable recording materials according to the invention can be effected with actinic light within the aforementioned wavelength range. The nature of the washout developer solvent depends on the constituents used for the buildup of the photopolymerizable recording materials according to the invention, in particular on the polymeric binder used and/or the photopolymerizable, olefinically unsaturated organic compounds. Accordingly, it is possible to use not only organic solvents or solvent mixtures but also aqueous developer solutions.

The color-forming system in the photopolymerizable recording materials according to the invention is of high stability. The photopolymerizable recording materials therefore show excellent dark storability without the addition of large amounts of a thermal inhibitor, as is necessary with prior art products. On exposure to actinic light the photopolymerizable recording materials according to the invention show an unexpectedly large increase in color intensity and a stronger color contrast between exposed and unexposed areas than is obtained with comparable prior art products where the photooxidant is an organic halogen compound. This is completely surprising, in particular since the prior art photographic recording materials based on a similar color-forming system where, however, compared with the photopolymerizable recording materials according to the invention, no photopolymerizable organic compounds, photoinitiators and sensitizers are present, show only a relatively weak color change within comparable exposure times. Effectively, the use of the photooxidants in the photopolymerizable recording materials according to the invention has no adverse effect on the other application properties important for the production and use of these recording materials. On the contrary, the materials according to the invention frequently even have somewhat better exposure properties. Also of advantage, in particular for their use in photoresist materials, is the weak fluorescence behavior of the sensitizers according to the invention, as a result of which it is possible to dispense with the addition of other substances for the absorption of such scatter radiation and it is possible to produce even finer conducting path structures. Moreover, the photopolymerizable recording materials according to the invention are surprisingly a solution to the residual layer problem, ie. the layers produced from the photopolymerizable recording materials according to the invention, subjected to imagewise exposure and developed are removable again from the substrate without leaving any residue even after a prolonged period by stripping with a solvent. This is of great importance in particular for the use as a photoresist, for example in the production of circuit boards and integrated circuits.

The invention is further illustrated by the Examples which follow. The parts and percentages in the Examples and Comparisons are by weight, unless otherwise stated.

EXAMPLE 1

A homogeneous mixture was prepared from the following constituents:
250 parts of ethyl acetate,
16 parts of trimethylolpropane triacrylate,
18 parts of the equimolar reaction product of bis phenol A bisglycidyl ether with acrylic acid, 54 parts of polymethyl methacrylate having a weight average molecular weight of 153,000,
3.0 parts of benzophenone,
0.15 part of 4-quinazolone of formula (V),
0.8 part of crystal violet leuco base,
2.0 parts of N-methoxy-2-picolinium tosylate,
0.05 part of Sicomet Patent Blue
6.0 parts of triethylene glycol diacetate.

This solution was first cast onto a polyester foil in such a way that the dry film thickness after solvent flashoff and drying was 35 μm. The optical density of the layer at 600 nm was 0.12. To produce a resist pattern, the photopolymerizable resist layer was laminated at 110° C. onto a copper-clad circuit board substrate and subjected to a 30-second exposure through a photographic negative in a flat exposure unit with actinic light of a wavelength of 360 nm; the polyester foil was then removed and the unexposed areas of the layer washed out with 1,1,1-trichloroethane. Exposure had brought about a strong deepening in the color intensity in the layer, the optical density of the layer at 600 nm changing by 0.64 to 0.76. The resist pattern produced was immaculately strippable from the substrate with methylene chloride, without a residual coating being left behind, even after storage for 3 days.

COMPARISON A

Example 1 was repeated, except that this time the 2 parts of N-methoxy-2-picolinium tosylate used in preparing the mixture were replaced by 3 parts of 2,5-dichloro-1,4-bis(dichloromethyl)benzene and the proportion of triethylene glycol diacetate was reduced from 5.94 parts to 4.94 parts. Starting from the same optical density at 600 nm of the unexposed resist layer, this time the increase in optical density brought about by exposure was merely 0.2. The color contrast between exposed and unexposed areas was appreciably weaker.

EXAMPLE 2

A homogeneous mixture was prepared from the following constituents:
250 parts of ethyl acetate,
18.5 parts of trimethylolpropane triacrylate,
16.5 parts of the equimolar reaction product of bis phenol A bisglycidyl ether with acrylic acid,
56 parts of polymethyl methacrylate/acrylic acid copolymer,
0.5 part of leuco crystal violet,
1.9 parts of 2,2'-bis(o-chlorophenyl)-4,4',5,5'-tetraphenylbisimidazolyl,
0.3 part of quinazolone of the formula (III),
0.05 part of Flexoblau,
6.5 parts of triethylene glycol diacetate.

Example 1 was repeated to produce a layer of 35 μm in thickness, which was applied to a copper-clad circuit board substrate.

Exposure as described in Example 1 brings about a strong deepening in the color intensity, the optical density of the layer at a wavelength of 600 nm increasing by 0.5 to 0.82.

COMPARISON B

Example 2 was repeated, except that this time the quinazolone of formula (III) was replaced in preparation of the mixture by an equivalent amount of Michler's ketone. Following exposure as described in Example 2 an optical density of 0.69 was measured, the same optical density as for the unexposed resist layer.

EXAMPLES 3 TO 11

Example 2 was repeated, the following optical densities OD were measured.

| Example | Sensitizer of formula | Photooxidant | OD |
|---|---|---|---|
| 3 | (II) | A | 0.73 |
| 4 | (IV) | B | 0.69 |
| 5 | (VI) | A | 0.76 |
| 6 | (VII) | A | 0.88 |
| 7 | (VIII) | A | 0.86 |
| 8 | (VIII) | B | 0.95 |
| 9 | (X) | A | 0.85 |
| 10 | (X) | B | 0.93 |
| 11 | (IX) | A | 0.86 |

A = 2,2'-bis(o-chlorophenyl)-4,4',5,5'-tetraphenylbis-imidazolyl
B = N—methoxy-2-picolinium tosylate

EXAMPLE 12

Preparation of sensitizer of the formula (V)

0.1 mol of p-diethylaminobenzoic acid, 0.1 mol of anthranilic acid, 0.1 mol of triphenyl phosphite and 2.0 ml of pyridine were heated at 100° C. for 4 hours. 0.1 mol of aniline was then added, and heating was continued at 100° C. for 3 hours. The pyridine was distilled off, and the residue was washed with 10% strength sodium hydroxide solution and dilute hydrochloric acid and then recrystallized from toluene.
Yield: 98%. Melting point: 165–169° C.

EXAMPLE 13

The sensitizers below were prepared by a method similar to that described in Example 12. The melting points of the compounds obtained are given below.

| Sensitizer of formula | Melting point |
|---|---|
| (VIII) | 158–162° C. |
| (IX) | 200° C. |
| (X) | 258° C. |

We claim:
1. A photopolymerizable recording material which comprises; one or more photopolymerizable olefinically unsaturated organic compounds, one or more photopolymerization initiators, a color-forming system which on irradiation with actinic light causes an increase in the color intensity of the recording material, one as a sensitizer, comprises one or more compounds of the formula (I)

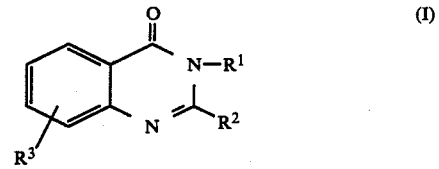

where $R^1$ is $C_1$-to $C_{12}$-alkyl, cycloalkyl, phenyl or halogen-, gen-, $C_1$- to $C_{12}$-alkyl-, nitrile-, trifluoromethyl-, $C_1$to $C_{12}$-alkoxy-, —O—CO—$_1$- to —$_{12}$-alkyl-, —CO—O—$_1$- to —$_{12}$-alkyl- or $NR^4R^5$-substituted aryl or hetaryl, where $R^4$ and $R^5$ are identical or different and each is $C_1$to $C_8$-alkyl, aryl—$_1$- to —$_6$-alkyl, where the aryl can be monosubstituted or polysubstituted by halogen, $C_1$- to $C_6$-alkyl or $C_1$- to $C_6$-alkoxy, or each is unsubstituted or $C_1$- to $C_6$-alkyl-, $C_1$- to $C_6$-alkoxy-, nitrile-, tri-fluoromethyl- or halogen-monosubstituted or -polysubstituted phenyl, unsubstituted or OH-, halogen-, CN-, —O—CO—$_1$- to —$_6$-alkyl- or —CO—O—$_1$- to —$_6$-alkyl-substituted $C_1$- to $C_{12}$-alkyl or oxaalkyl of 3 to 12 carbon atoms and 1 to 5 oxygen atoms, or $R^4$ and $R^5$ together form a saturated or unsaturated heterocyclic ring system, $R^2$ is $C_1$- to $C_{12}$-alkyl, cycloalkyl, phen—$_1$- to —$_6$-alkyl, aryl or hetaryl or $C_1$- to $C_{12}$-alkyl-, which may be substituted by OH, halogen, CN, —O—CO—$_1$- to —$_6$-alkyl or -CO-0—$_1$to —$_6$-alkyl, $C_1$- to $C_6$-alkoxy-, OH-, halogen-, CN- or —O—CO—$_1$- to —$_6$-alkyl-, -CO-0—$_1$- to —$_6$-alkyl-, oxa- alkyl- of 2 to 12 carbon atoms and 1 to 6 oxygen atoms or $NR^6R^7$ substituted aryl or hetaryl, where $R^6$ and $R^7$ are identical or different and each is $C_1$ - to $C_8$-alkyl, allyl, aryl—$_1$- to —$_6$-alkyl, where the aryl can be monosubstituted or polysubstituted by halogen, $C_1$- to $C_6$-alkyl or $C_1$- to $C_6$-alkoxy, or each is phenyl which is unsubstituted or monosubstituted or polysubstituted by $C_1$- to $C_6$alkyl, $C_1$- to $C_6$-alkoxy or halogen, or each is OH-, halogen-, CN-, —O—CO—$_1$- to —$_6$-alkyl- or -CO-0—$_1$- to —$_6$- alkyl-substituted $C_1$- to $C_{12}$-alkyl or oxaalkyl of 3 to 12 carbon atoms and 1 to 5 oxygen atoms, or $R^6$ and $R^7$ together form a saturated or unsaturated heterocyclic ring system, and $R^3$ is hydrogen, $C_1$- to $C_{12}$-alkyl, $C_1$- to $C_{12}$alkoxy, OH-, halogen-, CN-, -0-CO—$_1$ to —$_6$-alkyl- or —CO—O—$_1$- to —$_6$-alkyl-substituted $C_1$- to $C_{12}$-alkyl or oxaalkyl of 2 to 12 carbon atoms and 1 to 5 oxygen atoms, halogen, trialkylsilyl or perfluoro—$_1$- to -C$_7$-alkyl, with the proviso that the maximum of the long-wave absorption bands of these compounds is below 420 nm, preferably below 400 nm.

2. The photopolymerizable recording material of claim 1, wherein the sensitizer comprises one or more compounds of the formula (I) where $R^1$ and $R^2$ are each aryl as defined in claim 1 and $R^3$ is hydrogen.

3. The photopolymerizable recording material of claim 1, wherein the sensitizer comprises one or more compounds of the formula (I) where $R^1$ is phenyl or benzyl substituted as in claim 1, and $R^2$ is tituted aryl, $R^6$ and $R^7$ being as defined in claim 1.

4. The photopolymerizable recording material of claim 1, wherein the color-forming system which on irradiation with actinic light causes an increase in the color intensity of the recording material comprises (a) one or more colorless or virtually colorless organic compounds which are oxidizable to colored compounds, and
(b) a photooxidant for the colorless or virtually colorless organic compound(s) (a).

5. The photopolymerizable recording material of claim 4, wherein the photopolymerization initiator or photooxidant comprises one or more hexaarylbisimidazolyls.

6. The photopolymerizable recording material as claimed in claim 4, where photooxidant (b) comprises one or more N-alkoxypyridinium salts.

7. The photopolymerizable recording material as claimed in claim 1, wherein the colorless or virtually colorless organic compound which is oxidizable to a colored compound comprises a luco dye, in particular a triarylmethane dye in its leuco form.

8. The photoresist layer based on a photopolymerizable recording material as defined in claim 1.

9. A prhotoresist layer based on a photopolymerizable recording material as claimed in claim 4.

10. A lithographic printing plate based on a photopolymerizable recording material as defined in claim 1.

11. A lithographic printing plate based on a photopolymerizable recording material as defined in claim 4.

12. The photopolymerizable recording material of claim 1, which contains a polymeric binder.

13. The photopolymerizable recording material of claim 1, wherein the sensitizer has the formula

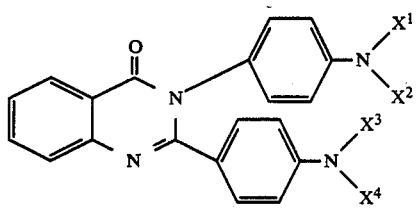

where $X^1$, $X^2$, $X^3$ and $X^4$ are identical to or different from each other and are each hydrocarbly of 1 to 12 carbon atoms which may be substituted by OH, CN, halogen, phenyl, —O—CO—$C_1$—to —$_6$—alkyl, —CO—O—Cl—to —$_6$-alkyl or oxaalkyl of 3 to 12 carbon atoms and 1 to 5 oxygen atoms.

14. The photopolymerizable recording material of claim 13, wherein $X^1$ to $X^4$ or the sensitizer are each alkyl of 1 to 4 carbon atoms.

15. The photopolymerizable recording material of claim 13, wherein $X^1$ to $X^4$ are each methyl or ethyl.

* * * * *

UNITED STATES PATENT AND TRADEMARK OFFICE
CERTIFICATE OF CORRECTION

PATENT NO. : 4,891,301

DATED : January 2, 1990

INVENTOR(S) : Reinhard ALDAG et al.

It is certified that error appears in the above-identified patent and that said Letters Patent is hereby corrected as shown below:

Claim 1, Column 20

Line 49, "one" should read --and--

Line 50, "comprises" should be deleted

Line 62, "gen-, gen-, $C_1$- to $C_{12}$-alkyl-" should read --gen-, $C_1$- to $C_{12}$-alkyl- --

Line 63, "-O-CO-$_1$- to -$_{12}$-alkyl," should read -- -O-CO-$C_1$-to -$C_{12}$-alkyl,--

Line 64, "-CO-O-$_1$- to -$_{12}$-alkyl-" should read -- -CO-O-$C_1$- to -$C_{12}$-alkyl- --

Line 66, "aryl-$_1$- to -$_6$-alkyl," should read --aryl-$C_1$-to -$C_6$-alkyl,--

Claim 1, Column 21

Line 4, "-O-CO-$_1$- to -$_6$-alkyl- or -CO-O-$_1$- to -$_6$-alkyl-substituted" should read -- -O-CO-$C_1$- to -$C_6$-alkyl- or -CO-O-$C_1$- to -$C_6$-alkyl-substituted--

Line 8, "phen-$_1$ to -$_6$-alkyl," should read --phen-$C_1$-to -$C_6$-alkyl--

Line 10, "-O-CO-$_1$- to -$_6$-alkyl or -CO-O-$_1$ to -$_6$-alkyl," should read -- -O-CO-$C_1$- to -$C_6$-alkyl or -CO-O-$C_1$- to -$C_6$-alkyl,--

Line 12, "-O-CO-$_1$- to -$_6$-alkyl-, -CO-O-$_1$- to -$_6$-alkyl-," should read -- -O-CO-$C_1$- to -$C_6$-alkyl-, -CO-O-$C_1$- to -$C_6$-alkyl-,--

UNITED STATES PATENT AND TRADEMARK OFFICE
CERTIFICATE OF CORRECTION

PATENT NO. : 4,891,301

DATED : January 2, 1990

INVENTOR(S) : Reinhard ALDAG et al.

It is certified that error appears in the above-identified patent and that said Letters Patent is hereby corrected as shown below:

Claim 1, Column 21

Line 17, "aryl-$_1$- to -$_6$-alkyl," should read --aryl-$C_1$- to -$C_6$-alkyl,--

Line 24, "-O-CO-$_1$- to -$_6$-alkyl- or -CO-O-$_1$- to -$_6$-" should read ---O-CO-$C_1$- to -$C_6$-alkyl- or -CO-O-$C_1$- to -$C_6$- --

Line 29, "-O-CO-$_1$ to -$_6$-alkyl- or -CO-O-$_1$- to -$_6$-alkyl-substituted" should read -- -O-CO-$C_1$ to -$C_6$-alkyl- or -CO-O-$C_1$- to -$C_6$-alkyl-substituted--

Line 33, "perfluoro-$_1$-" should read --perfluoro-$C_1$- --

Claim 3, Column 21, Line 46

"and $R^2$ is tituted aryl" should read --and $R^2$ is $NR^6R^7$-substituted aryl--

Claim 7, Column 22, Line 16

"a luco dye" should read --a leuco dye--

Claim 9, Column 22, Line 20

"prhotoresist" should read --photoresist--

Claim 13, Column 22, Line 41

"hydrocarbly" should read --hydrocarbyl--

UNITED STATES PATENT AND TRADEMARK OFFICE
CERTIFICATE OF CORRECTION

PATENT NO. : 4,891,301

DATED : January 2, 1990

INVENTOR(S) : Reinhard ALDAG et al.

It is certified that error appears in the above-identified patent and that said Letters Patent is hereby corrected as shown below:

Claim 13, Column 22, Line 43

"$-O-CO-C_1-$ to $-_6$-alkyl, $-CO-O-C_1-$ to $-_6$-alkyl" should read ---$O-CO-C_1-$ to $-C_6$-alkyl, $-CO-O-C_1$ to $-C_6$-alkyl--

Signed and Sealed this

Third Day of September, 1991

*Attest:*

HARRY F. MANBECK, JR.

*Attesting Officer*      *Commissioner of Patents and Trademarks*